(12) United States Patent
Jeon et al.

(10) Patent No.: US 12,050,314 B2
(45) Date of Patent: Jul. 30, 2024

(54) STRETCHABLE TRANSPARENCY-ADJUSTING FILM HAVING AN ORIENTATED HETEROGENEOUS INTERFACE, METHOD FOR MANUFACTURING THE SAME AND SMART WINDOW HAVING STRETCHABLE TRANSPARENCY-ADJUSTING FILM

(71) Applicant: Korea Advanced Institute of Science and Technology, Daejeon (KR)

(72) Inventors: Seokwoo Jeon, Daejeon (KR); Donghwi Cho, Daejeon (KR); Sanghyeon Nam, Daejeon (KR); Youngsuk Shim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 395 days.

(21) Appl. No.: 17/344,173

(22) Filed: Jun. 10, 2021

(65) Prior Publication Data

US 2021/0389585 A1 Dec. 16, 2021

(30) Foreign Application Priority Data

Jun. 12, 2020 (KR) .................. 10-2020-0071343

(51) Int. Cl.
*G02B 26/00* (2006.01)
*E06B 9/24* (2006.01)
(Continued)

(52) U.S. Cl.
CPC ............. *G02B 26/023* (2013.01); *E06B 9/24* (2013.01); *G02B 5/0236* (2013.01); *G03F 7/2045* (2013.01); *E06B 2009/2417* (2013.01)

(58) Field of Classification Search
CPC .. G02B 26/023; G02B 5/0236; G02B 5/0247; G02B 1/04; G02B 5/0268
See application file for complete search history.

(56) References Cited

U.S. PATENT DOCUMENTS

2018/0244876 A1 8/2018 Yang et al.

FOREIGN PATENT DOCUMENTS

| EP | 3 351 719 A1 | 7/2018 |
| JP | H 11305036 A | 11/1999 |

(Continued)

OTHER PUBLICATIONS

Lee, et al., "Tilted Pillars on Wrinkled Elastomers as Reversibly Tunable Optical Window," Advanced Materials, 2014, 7 pages.

(Continued)

*Primary Examiner* — Joseph P Martinez
(74) *Attorney, Agent, or Firm* — DALY, CROWLEY, MOFFORD & DURKEE, LLP

(57) ABSTRACT

A stretchable transparency-adjusting film includes an inner elastic part having a three-dimensional network shape and including a first elastomer, an inorganic thin film surrounding the inner elastic part, and an outer elastic part surrounding the inorganic thin film and including a second elastomer. A scattering unit defined by the inner elastic part, the inorganic thin film and the outer elastic part in a cross-section is orientated in an inclined direction to a vertical direction and a horizontal direction.

6 Claims, 8 Drawing Sheets

(51) Int. Cl.
*G02B 5/02* (2006.01)
*G02B 26/02* (2006.01)
*G03F 7/20* (2006.01)

(56) References Cited

FOREIGN PATENT DOCUMENTS

| KR | 10-0596589 B1 | 7/2006 | | |
|----|---|---|---|---|
| KR | 10-2012-0021647 A | 3/2012 | | |
| KR | 10-2013-0060999 A | 6/2013 | | |
| KR | 10-1358988 B1 | 2/2014 | | |
| KR | 10-1391730 B1 | 5/2014 | | |
| KR | 10-1400363 B1 | 6/2014 | | |
| KR | 10-1542684 B1 | 8/2015 | | |
| KR | 20160080132 | * | 7/2016 | ............... G03F 7/00 |
| KR | 10-1887481 B1 | 8/2018 | | |
| KR | 10-1902380 B1 | 10/2018 | | |
| KR | 10-1902382 B1 | 10/2018 | | |
| KR | 10-1919906 B1 | 11/2018 | | |
| KR | 10-2018-0028625 A | 7/2019 | | |
| KR | 10-2019-0118033 A | 6/2020 | | |

OTHER PUBLICATIONS

Ge, et al., "A Robust Smart Window: Reversibly Switching from High Transparency to Angle Independent Structural Color Display," Advanced Materials, 2015, 7 pages.
Kim, et al., "Multistate and On-Demand Smart Windows," Advanced Materials, 2018, 7 pages.
Zeng, et al., "Bio-inspired sensitive and reversible mechanochromisms via strain-dependent cracks and folds," Nature Communications, Jul. 8, 2016; 9 pages.

* cited by examiner

STRETCHABLE TRANSPARENCY-ADJUSTING FILM HAVING AN ORIENTATED HETEROGENEOUS INTERFACE, METHOD FOR MANUFACTURING THE SAME AND SMART WINDOW HAVING STRETCHABLE TRANSPARENCY-ADJUSTING FILM

CROSS-REFERENCE TO RELATED APPLICATION

This application claims priority to and benefits of Korean Patent Application No. 10-2020-0071343 under 35 U.S.C. § 119 filed on Jun. 12, 2020 in the Korean Intellectual Property Office, the entire contents of which are incorporated herein by reference.

BACKGROUND

1. Technical Field

Embodiments relate to a film capable of adjusting a transparency. More particularly, Embodiments relate to a stretchable transparency-adjusting film having an orientated heterogeneous interface for improving a light-scattering efficiency, a method for manufacturing the stretchable transparency-adjusting film and a smart window including a stretchable transparency-adjusting film.

2. Description of the Related Art

Recently, a light-modulating technology is being researched and developed to improve or replace a conventional window.

Since an electrochromic device and a suspended particle device (SPD), which are controlled by an external electrical signal, requires an electric field to control alignment of scattering members dispersed therein, they have complicated configurations and cost high. Furthermore, they are not compatible with conventional window systems. In addition, since photochromic and thermochromic technologies are based on chemical changes, their durability and stability may be relatively poor. Furthermore, because of slow reaction rates and inevitable color changes, they have limited applications such as sunglasses/

As a technology that may be free from the above problems, optical modulation technologies controlled by mechanical deformation according to a simple principle has recently been focused. For example, a stretchable optical film capable of adjusting a transparency depending on a strain by using a light scattering phenomenon at a structural interface, which occurs when light is incident on a scattering structure such as a micro or nano-structure (wrinkle, crack, pillar, hole, particle, etc.), has been being studied.

Such a stretchable optical film may have a bilayer structure in which a scattering structure is formed on a surface of a stretchable elastomer (elastic polymer), and may adjust a transparency by using a scattering phenomenon of light due to a difference between a refractive index of the scattering structure and a refractive index of an external medium. When a stretchable optical film has a two-dimensional structure, an optical modulation performance may be poor since a scattering effect that mostly occurs in the structure on the surface has a low optical density. Furthermore, the stretchable optical film having a two-dimensional structure is weak at variation of external environments including temperature, humidity, and severe mechanical deformation, resulting in performance degradation and durability problem.

Recently, in order to overcome the above technical limitations of the stretchable optical film having a two-dimensional structure, a stretchable composite having a three-dimensional scattering structure has been being studied. Such a three-dimensional scattering structure can control a transparency with a high contrast because a heterogeneous interface that causes light scattering has a high density. However, it requires a large tensile force because of an unordered porous structure. Particularly, it is difficult to achieve high uniformity over a large area for practical applications.

SUMMARY

One object of the invention is to provide a stretchable transparency-adjusting film with an improved light-scattering efficiency.

Another object of the invention is to provide a method for manufacturing the stretchable transparency-adjusting film.

Another object of the invention is to provide a smart window including a stretchable transparency-adjusting film.

According to an embodiment of the invention, a stretchable transparency-adjusting film includes an inner elastic part having a three-dimensional network shape and including a first elastomer, an inorganic thin film surrounding the inner elastic part, and an outer elastic part surrounding the inorganic thin film and including a second elastomer. A scattering unit defined by the inner elastic part, the inorganic thin film and the outer elastic part in a cross-section is orientated in an inclined direction to a vertical direction and a horizontal direction.

In an embodiment, the inorganic thin film includes an oxide.

In an embodiment, the inorganic thin film includes alumina.

In an embodiment, a thickness of the inorganic thin film is 60 nm to 80 nm.

In an embodiment, at least one of the first and second elastomers includes polydimethyl siloxane.

In an embodiment, lines connecting four scattering units adjacent to each other in a cross-sectional view form a parallelogram shape.

In an embodiment, the inclined direction is inclined to the horizontal direction by 50° to 80°.

In an embodiment, the inorganic thin film has an inclined body-centered tetragonal structure.

According to an embodiment of the invention, a smart window includes a window part including a stretchable transparency-adjusting film and a fixing clamp that fixes an end of the stretchable transparency-adjusting film, and a driving part adjusting a strain of the stretchable transparency-adjusting film. The stretchable transparency-adjusting film includes an inner elastic part having a three-dimensional network shape and including a first elastomer, an inorganic thin film surrounding the inner elastic part, and an outer elastic part surrounding the inorganic thin film and including a second elastomer. A scattering unit defined by the inner elastic part, the inorganic thin film and the outer elastic part in a cross-section is orientated in an inclined direction to a vertical direction and a horizontal direction. The stretchable transparency-adjusting film has a transparency variable according to a gap formed therein when strained.

According to an embodiment of the invention, a method for manufacturing a stretchable transparency-adjusting film is provided. According to the method, a phase mask is disposed on a photosensitive film. A light is provided to the photosensitive film. The light has a three-dimensionally distribution through the phase mask. The photosensitive film is developed to form a porous template film including a template part having a three-dimensional network shape and a pore part defined by the template part. An outer elastic part is formed in the pore part. The outer elastic part includes a first elastomer and has an inverse shape to the template part. The template part is removed to form a pore part defined by the outer elastic part. An inorganic thin film is formed on an inner wall of the outer elastic part. An inner elastic part is formed in the pore part surrounded by the inorganic thin film. The inner elastic part includes a second elastomer. The light having a three-dimensionally distribution is incident on the photosensitive film in an inclined direction to a vertical direction and a horizontal direction of the photosensitive film. A scattering unit defined by the inner elastic part, the inorganic thin film and the outer elastic part in a cross-section is orientated in the inclined direction.

According to embodiments of the invention, a stretchable transparency-adjusting film capable of adjusting a transparency according to strain/restoration may be obtained.

Furthermore, a stretchable transparency-adjusting film may have an inclined three-dimensional structure. When the stretchable transparency-adjusting film is strained, an inclined gap may appear therein. The inclined gap may form more scattering boundaries to a light-progressing direction than a gap extending along a vertical direction. Thus, more transparency difference may be obtained by less strain.

DETAILED DESCRIPTION OF THE EMBODIMENTS

Figure 1:
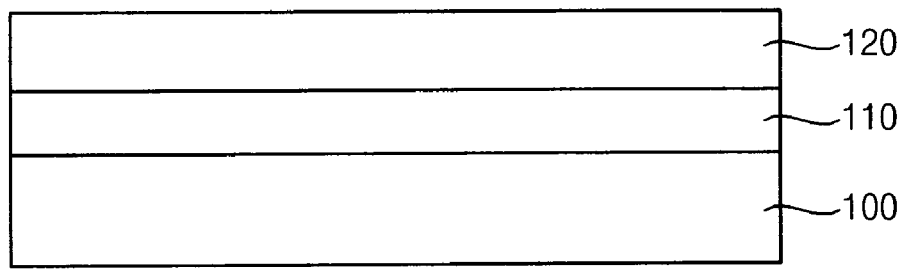
FIGS. 1, 2, 3, 4, 5, 6, 7 and 8 are cross-sectional views illustrating a method for manufacturing a stretchable transparency-adjusting film according to an embodiment.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments provide a stretchable transparency-adjusting film capable of efficiently controlling a transparency by adjusting a scattering boundary through simple stretching/releasing. In embodiments, a stretchable transparency-adjusting film including a stretchable elastomer (elastic polymer) and a three-dimensional inorganic thin film, a method for the stretchable transparency-adjusting film and a smart window including the stretchable transparency-adjusting film are provided.

When the stretchable transparency-adjusting film is strained, a gap, which may be an air gap, is formed by difference between mechanical behaviors of the elastomer and the inorganic thin film. The gap, which has a refractive index of 1 for an air, isolates an inner elastic part in a body centered tetragonal (BCT) unit cell coated with the inorganic thin film, which has a refractive index of 1.7 for alumina, thereby forming a scattering particle. As a result, a light-scattering effect (Mie scattering) occurs at an interface between the inorganic thin film and the gap over an entire range of a visible ray.

When a tensile force having been applied to the stretchable transparency-adjusting film is removed, the gap disappears by restoration of the elastomer. Thus, an interface of elastomer/inorganic thin film/elastomer is formed thereby behaving as a unitary medium (generally, a medium with a scale less than $1/10$ of a wavelength of a light incident thereon may be optically transparent).

A stretchable transparency-adjusting film according to embodiments is based on a periodic structure. Thus, the stretchable transparency-adjusting film may include an efficient material and may reliably adjust a transparency. Furthermore, the stretchable transparency-adjusting film may be enlarged through a large scale optical patterning method and atomic layer deposition, and may be coupled to an IOT (internet of things) technology recently advancing to achieve a smart window device that spontaneously adjusts a transparency in response to variance of external environments.

A three-dimensional periodic nano-composite used for embodiments may be formed by various methods such as self-assembly, interference lithography, stereo lithography, holographic lithography, direct ink writing, 3D printing or the like. In order to explain methods for forming the three-dimensional periodic nano-composite, disclosure of Korean Patent Application Nos. 2018-0041150 and 2016-0116160 and Korean Granted Patent 1391730, 1400363, 1358988, 1919906 and 1902382 may be incorporated herein by reference.

Hereinafter, an embodiment using a proximity-field nanopatterning (PnP) will be explained as an example.

Figure 2:
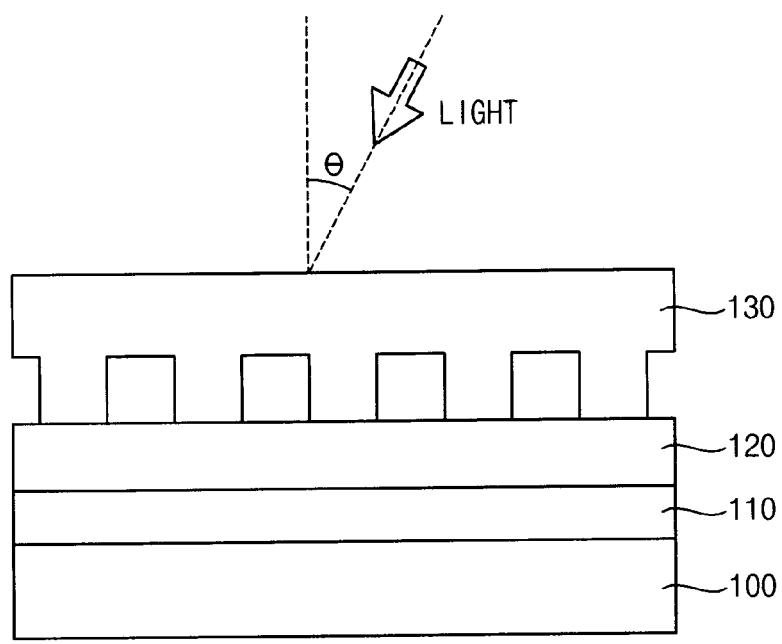
Figure 3:
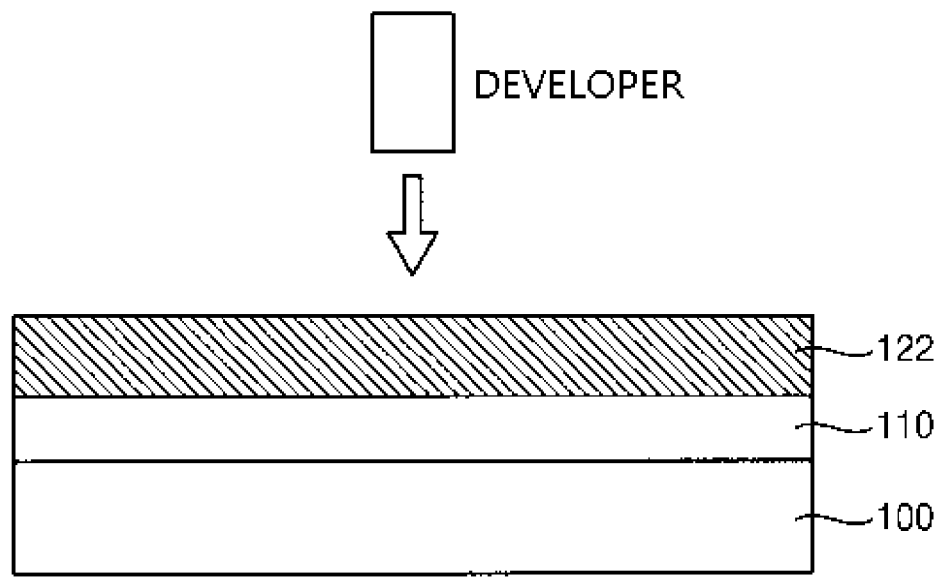

FIGS. 1, 2, 3, 4, 5, 6, 7 and 8 are cross-sectional views illustrating a method for manufacturing a stretchable transparency-adjusting film according to an embodiment. Particularly, FIGS. 1, 2 and 3 are cross-sectional views illustrating a method for forming a three-dimensional porous template. FIGS. 4, 5, 6, 7 and 8 are enlarged cross-sectional views illustrating a method for forming a stretchable transparency-adjusting film from the three-dimensional porous template.

Referring to FIG. 1, a sacrifice layer 110 is formed on a base substrate 100.

For example, the base substrate 100 may include silicon, glass, quartz, sapphire, a polymer, a metal. For example, the polymer may include polymethyl methacrylate (PMMA), polyethylene terephthalate (PET), polycarbonate (PC), polyimide (PI), polyamide (PA), polypropylene (PP) or the like.

The sacrifice layer 110 may function to easily separate the base substrate 100 from a stretchable film formed thereon in a following process. For example, the sacrifice layer 110 may be formed by coating and curing (light-exposing and baking) a photoresist composition.

Thereafter, a photosensitive film 120 is formed on the sacrifice layer 110. For example, a photoresist composition may be coated on the sacrifice layer 110, and then soft-baked at a temperature of about 50° C. to about 100° C. to form the photosensitive film 120. A time for heating (baking) the photoresist composition may be properly adjusted. For example, the photoresist composition may be heated for about 5 minutes to about 3 hours.

For example, the photoresist composition for forming the photosensitive film 120 may include an organic-inorganic hybrid material, hydrogel, a phenolic resin, an epoxy resin or the like, which may be cross-linked by light exposure. For example, SU-8 series, KMPR series, ma-N 1400, which are from MicroChem, NR6-6000p from Futurrex or the like may be used for the photoresist composition.

Referring to FIG. 2, a phase mask 130 is disposed to contact a surface of the photosensitive film 120. A light having a three-dimensional periodic distribution through the phase mask 130 is irradiated onto the photosensitive film 120. For example, a contact surface of the phase mask 130 may have an uneven surface (convexo-concave structure). A light having passed through the phase mask 130 may have a three-dimensional periodic distribution by interference effect.

For example, the phase mask 130 may have an uneven lattice structure formed at a surface, through which a light passes, and may include a flexible elastomer material. When the phase mask 130 contacts the photoresist film 120, the phase mask 130 may spontaneously adhere to or conformal-contact a surface of the photosensitive film 120 by Van der Waals force.

For example, when a laser having a wavelength similar to a period of the lattice-structure of the phase mask 130 is irradiated onto the phase mask 130, a three-dimensionally distributed light may be formed by Talbot effect. When the photosensitive film 120 is formed from a negative-tone photoresist composition, cross-linking of a resin may be selectively caused in a portion where light intensity is relatively high by constructive interference, and may be hardly caused in a remaining portion where light intensity is relative low. Thus, the remaining portion, which is barely or not light-exposed, may be removed in a developing process. As a result, a porous structure having a three-dimensional network with channels arranged with a period of nanometers to micrometers depending on a wavelength of the laser and a shape of the phase mask 130 may be obtained.

In an embodiment, a pore size and a periodicity of the porous structure may be adjusted by changing pattern period of the phase mask 130 and a wavelength of an incident light.

For example, the phase mask 130 used in the PnP process may include a material such as polydimetylsiloxane (PDMS), polyurethane acrylate (PUA), perfluoropolyether (PFPE) or the like.

For example, an exposing dose energy may be about 10 300 mJ/cm$^2$ to about 300 mJ/cm$^2$ depending on a thickness of the photosensitive film 120.

In an embodiment, a light irradiated onto the phase mask 130 may be inclined to a vertical direction to an upper surface of the photosensitive film 120. For example, an incident angle $\Theta$ of the light irradiated onto the phase mask 130 may be 10° to 60°. Adjusting the incident angle of the light irradiated onto the phase mask 130 may change a shape, an orientation or the like for a pattern in a porous template film 122 and for scattering units of a stretchable transparency-adjusting film formed therefrom. A method for irradiating the light in a direction inclined to the photosensitive film 120 is not limited to the above. For example, an inclining jig or the like may be used for inclining the photosensitive film 120.

For example, the light-exposed photosensitive film 120 may be baked at a temperature of about 50° C. to about 100° C. A time for heating (baking) the photosensitive film 120 may be properly adjusted. For example, the photosensitive film 120 may be heated for about 5 minutes to about 30 minutes.

The photosensitive film 120 is formed from a negative-type chemical amplification resist, a light-exposed portion may be cured by baking. Thus, a light-exposed pattern may be enlarged by repeating light-exposure before a baking process is performed.

Referring to FIG. 3, the light-exposed photosensitive film 120 may be developed to form a porous template film 122.

In an embodiment, developing the light-exposed photosensitive film 120 may be performed by two steps. For example, after a first developing process is performed with a first developing solution having a lower concentration, a second developing process may be performed with a second developing solution having a higher concentration. For example, after an upper portion of the photosensitive film 120 is developed by the first developing process, an entire portion of the photosensitive film 120 may be developed by the second developing process to form a porous template film 122 having a three-dimensional structure. In an embodiment, a rinsing process may be performed after the first developing process before the second developing process.

When a thickness of the photosensitive film 120 is increased, uniformly developing the photosensitive film 120 may be difficult. For example, when a time, for which the photosensitive film 120 is exposed to a developing solution, is increased, a developing difference along a thickness direction may be increased, and an upper portion of the photosensitive film 120 may be damaged.

In an embodiment, as developing the photosensitive film 120 is performed by two steps, a stability of the upper portion of the photosensitive film 120 may be increased. Furthermore, as a time, for which the photosensitive film 120 is exposed to the developing solution having a higher concentration, is reduced, damage to the upper portion of the porous template film 122 may be prevented. Accordingly, uniformity and reliability of a three-dimensional nano-composite may be improved.

For example, the developing solution may include propylene glycol monomethyl ether acetate (PGMEA), ethyl lactate, diacetone alcohol, tetramethyl ammonium hydroxide (TMAH), a developing solution for Su-8 or the like.

In an embodiment, the developing solution may include an alkali compound such as TMAH. For example, a content of the alkali compound in the lower-concentration developing solution may be 50% or less of that in the higher-concentration developing solution, for example, 10% to 50%. The lower-concentration developing solution may be obtained by diluting the higher-concentration developing solution (for example, an undiluted solution of a commercial developer) with deionized water.

Furthermore, deionized water, an alcohol such as ethanol or isopropyl alcohol, or the like may be used for rinsing.

Figure 4:
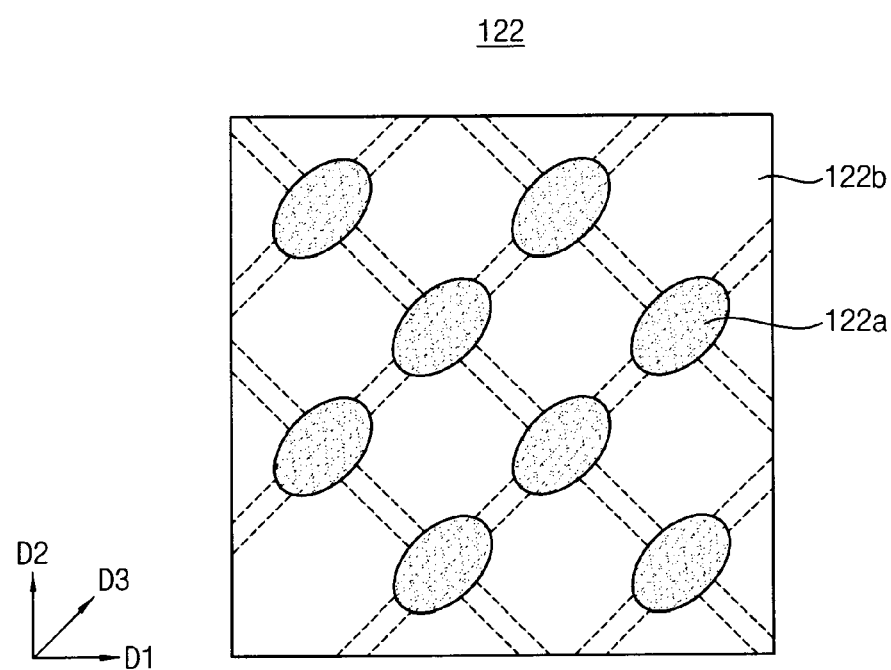

Referring to FIG. 4, the porous template film 122 may have a periodically ordered three-dimensional network structure. For example, the porous template film 122 may include a template part 122a having a three-dimensionally continuous network shape and a pore part 122b defined by the template part 122a. Furthermore, an inner pattern of the template part 122a may be orientated in a direction depending on an incident angle of a light irradiated onto the photosensitive film 120. For example, in a cross-sectional view, an inner pattern of the template part 122a may be orientated in an inclined direction D3 to a horizontal direction D1 and a vertical direction D2 of the porous template film 122.

Figure 5:
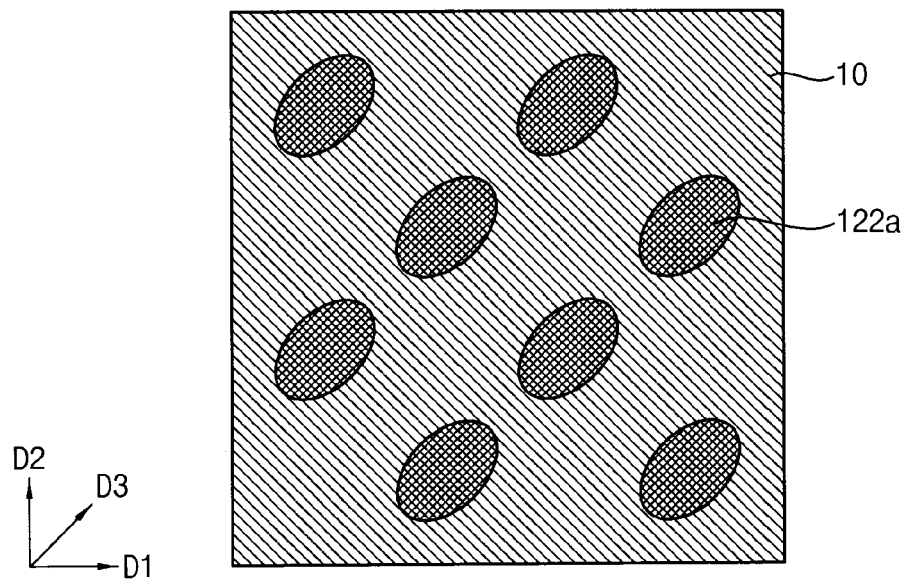

Referring to FIG. 5, a liquid silicone resin is provided in the pore part 122b of the porous template film 122 and cured to form an outer elastic part 10. In an embodiment, the outer elastic part 10 may include or be formed from a PDMS resin. The liquid silicone resin may include a PDMS and a curing agent.

For example, the liquid silicone resin is provided to be coated on the porous template film 122. The liquid silicone resin may enter and fill the pore part 122b through vacuum treatment using a desicator, a vacuum pump or the like.

The liquid silicone resin may be cured by heating or the like. Thereafter, the template part 122a and the sacrifice layer 110 may be removed.

A remover may be used for removing the template part 122a and the sacrifice layer 110. Various organic solvents may be used as the remover depending on materials of the template part 122a and the sacrifice layer 110. For example, the remover may include acetone, ethanol, N-methyl pyrrolidone (NMP), dimethyl sulfoxide (DMSO) or the like.

Figure 6:
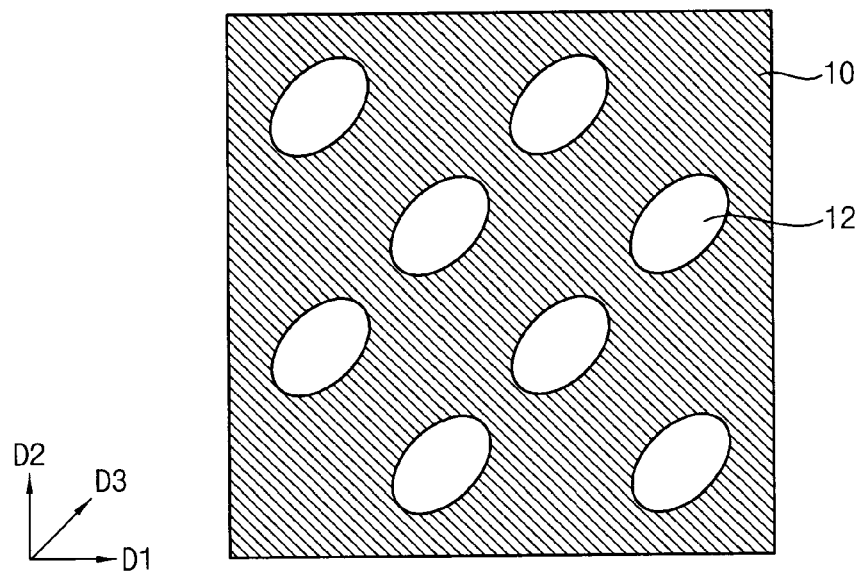
Figure 7:
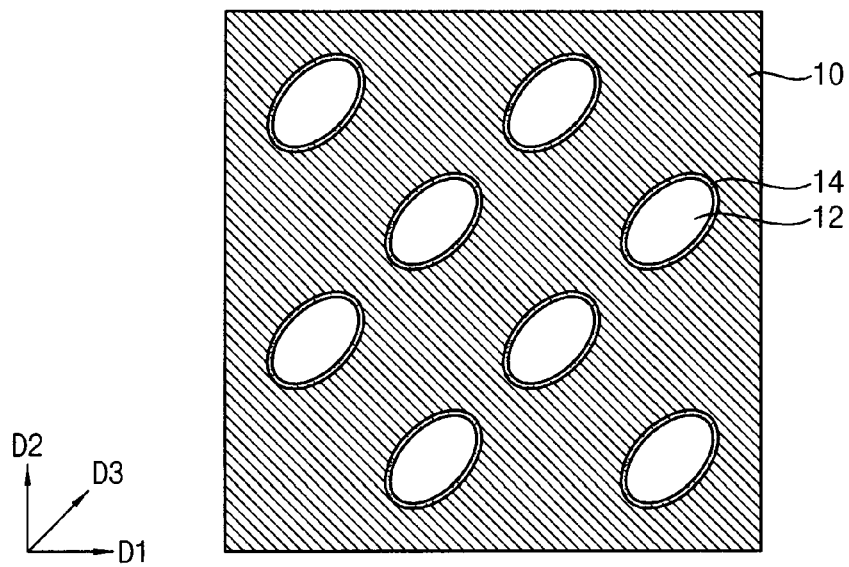

When the template part 122a is removed, a stretchable film including an outer elastic part 10 and a pore part 12 defined by the outer elastic part 10 may be obtained as illustrated in FIG. 6. The outer elastic part 10 may have an inverse shape to the template part 122a of the porous template film 122. The pore part 12 may have a three-dimensionally continuous network shape corresponding to a shape of the template part 122a of the porous template film 122.

Thereafter, an inorganic thin film 14 is formed on an inner wall of the outer elastic part 10. The inorganic thin film 14 is formed on the inner wall of the outer elastic part 10 thereby having a shape surrounding the pore part 12.

In an embodiment, the inorganic thin film 14 may include an oxide. For example, the inorganic thin film 14 may include alumina, silica, titania, tungsten oxide, zinc oxide, tin oxide, silicate or a combination thereof. In an embodiment, the inorganic thin film 14 may include alumina. Alumina has a refractive index (about 1.7) similar to a refractive index of PDMS, which is about 1.4, thereby increasing a scattering effect. Particularly, when a stretchable film does not have a gap, the stretchable film may have a large transparency because refractive indexes are relatively matched (a refractive index difference is about 0.3). When a gap appears in the stretchable film by stretching and a difference between mechanical properties of the inorganic thin film 14 and PDMS, a scattering effect may be increased because a refractive index difference between the gap and the inorganic thin film 14 is larger than a refractive index difference between the gap and PDMS.

Furthermore, since alumina has a relatively small adhesion to PDMS, alumina may be easily separated from PDMS to form the gap. However, embodiments are limited thereto. Other inorganic materials may be selected for the inorganic thin film 10 in view of other properties such an adhesion to the outer elastic part 10, a tensile strength or the like.

For example, the inorganic thin film 14 may be formed by chemical vaporization deposition (CVD) such as atomic layer deposition (ALD) or the like. For example, the inorganic thin film 14 may be formed by ALD using an aluminum precursor such as trimethylaluminum or the like.

In an embodiment, before the inorganic thin film 14 is formed, a surface of the outer elastic part 10 may be modified. For example, the outer elastic part 10 may be treated with UV/ozone to form a silica thin film on the inner wall of the outer elastic part 10. The silica thin film may have a small thickness, for example, 20 nm or less, preferably 10 nm or less. Because a hydrophilicity of the surface of the outer elastic part 10 is increased by the surface treatment, adsorption of a precursor for forming the inorganic thin film 14 may be increased. Thus, ease of forming the inorganic thin film 14 and adjusting a thickness of the inorganic thin film 14 may be improved.

Thereafter, an inner elastic part 16 is formed in the pore part 12. The inner elastic part 16 may include a substantially same material as the outer elastic part 10, for example, a PDMS resin. The inner elastic part 16 may be formed by a similar method to the outer elastic part 10. For example, a liquid silicone resin may be provided to be coated on a stretchable film having the inorganic thin film 14. The liquid silicone resin may enter and fill the pore part 12 through vacuum treatment using a desicator, a vacuum pump or the like. The liquid silicone resin may be cured by heating or the like to form the inner elastic part 16. For example, the inner elastic part 16 may have a three-dimensionally continuous network shape.

In an embodiment, the inner elastic part 16 and the outer elastic part 10 may include a same elastic material. However, embodiments are not limited thereto. For example, the inner elastic part 16 and the outer elastic part 10 may include different materials from each other as desired.

Accordingly, a stretchable transparency-adjusting film 130 including the inner elastic part 16, the outer elastic part 10 and the inorganic thin film 14 may be obtained. For example, the outer elastic part 10 may have a matrix shape surrounding the inner elastic part 16 and the inorganic thin film 14 in a cross-sectional view. The inorganic thin film 14 may have a shape surrounding the inner elastic part 16 in the cross-sectional view.

When a tensile force is not applied to the stretchable transparency-adjusting film 130, a scattering boundary is not formed in the stretchable transparency-adjusting film 130. Thus, the stretchable transparency-adjusting film 130 may have a large transparency, for example, 90% or more.

When a tensile force is applied to the stretchable transparency-adjusting film 130, the stretchable transparency-adjusting film 130 is strained. In a cross-sectional view, a tensile force applied to the outer elastic part 10 may be structurally larger than a tensile force applied to the inner elastic part 10, and deformation of the inner elastic part 16 may be limited by the inorganic thin film 14. Thus, a gap may be formed between the outer elastic part 10 and the inorganic thin film 14. The gap may isolate the inner elastic part 16 thereby forming a scattering particle. Thus, scattering of a light passing through the stretchable transparency-adjusting film 130 is increased so that a transparency of the stretchable transparency-adjusting film 130 is reduced.

The stretchable transparency-adjusting film 130 may have a large elasticity and resilience. Thus, when a tensile force is removed from the stretchable transparency-adjusting film 130, the stretchable transparency-adjusting film 130 may be restored so that a transparency of the stretchable transparency-adjusting film 130 is increased.

In an embodiment, a thickness of the stretchable transparency-adjusting film 130 may be about 5 μm or more, preferably about 10 μm or more. When a thickness of the stretchable transparency-adjusting film 130 is excessively small, availability for a smart window or the like may be deteriorated because a transparency difference (contrast) between strain and restoration is small. When a thickness of the stretchable transparency-adjusting film 130 is excessively large, a transparency of a normal state, when the stretchable transparency-adjusting film 130 is not strained, may be excessively reduced.

In an embodiment, a thickness of the inorganic thin film 14 may be more than 40 nm and equal to or less than 100 nm, preferably 60 nm to 80 nm. When a thickness of the inorganic thin film 14 is excessively small, interface separation and a gap may not appear even when a tensile force is applied to the stretchable transparency-adjusting film 130. When a thickness of the inorganic thin film 14 is excessively large, elasticity of the inorganic thin film 14 and the inner elastic part 16 limited by the inorganic thin film 14 may be reduced thereby decreasing a scattering effect.

In an embodiment, in view of a wavelength of a visible ray, a size (width) of a gap for forming a scattering particle, when the stretchable transparency-adjusting film 130 is strained, may be about 60 nm or more, or about 120 nm or more.

A strain for forming the gap may be about 10% or more, and may be limited to about 60% or less to prevent damage to the stretchable transparency-adjusting film 130.

When the stretchable transparency-adjusting film 130 is strained, the inorganic thin film 14 may be fragmented or cracked. However, because the inorganic thin film 14 is attached to the elastic part by Van der Waals force or the like, an entire shape of the inorganic thin film 14 may be maintained even though fragmented or cracked. Furthermore, fragments or cracks of the inorganic thin film 14 may increase a scattering effect.

In an embodiment, the inorganic thin film 14 may have a body-centered tetragonal (BCT) structure. Particularly, the inorganic thin film 14 may have an inclined BCT structure.

In an embodiment, the porous template film formed by PnP method may have a BCT structure, and the inorganic thin film 14 has a shape surrounding a template part of the porous template film. Thus, the inorganic thin film 14 may macroscopically have a BCT structure, and microscopically have a nano-shell structure.

However, embodiments are not limited thereto. A network of the inorganic thin film 14 may have a face-centered cubic structure or a simple cubic structure. For example, when a tensile force is applied to the stretchable transparency-adjusting film 130 in a direction of x-axis, the inorganic thin film 14 with a face-centered cubic structure or a simple cubic structure may be advantageous in increasing a size of a gap with respect to a strain.

In an embodiment, the outer elastic part 10 and the inner elastic part 16 may include PDMS. However, embodiments are not limited thereto. For example, the inorganic thin film 14 has a continuous network structure, elastic parts including a material having a Poisson's ratio different from that of PDMS may be advantageous in forming a gap.

In an embodiment, the stretchable transparency-adjusting film 130 may include scattering units SU that are three-dimensionally arranged. For example, the scattering unit SU may be defined by the inner elastic part 16, the inorganic thin film 14 surrounding the inner elastic part 16 and the outer elastic part 14 surrounding the inorganic thin film 14.

In an embodiment, the scattering units SU may have orientation in a direction inclined to a plane of the stretchable transparency-adjusting film 130. For example, the scattering units SU may be orientated in an inclined direction D3 to a horizontal direction D1 and a vertical direction D2 of the stretchable transparency-adjusting film 130 by a predetermined angle. For example, an orientation angle Θ of the scattering units SU to the horizontal direction D1 of the stretchable transparency-adjusting film 130 may be 30° to 80° or 50° to 80°.

In an embodiment, the scattering units SU may be arranged such that virtual lines connecting fourth of the scattering units SU, which are adjacent to each other in a cross-sectional view, form a parallelogram shape. Such configuration may decrease distance between the scattering units SU thereby increasing a scattering area. Thus, a scattering effect of the stretchable transparency-adjusting film 130 may be increased.

However, embodiments are not limited thereto. For example, the scattering units SU may be arranged such that lines connecting fourth of the scattering units SU, which are adjacent to each other in a cross-sectional view, form a rhombus shape or a rectangular shape.

Figure 9A:
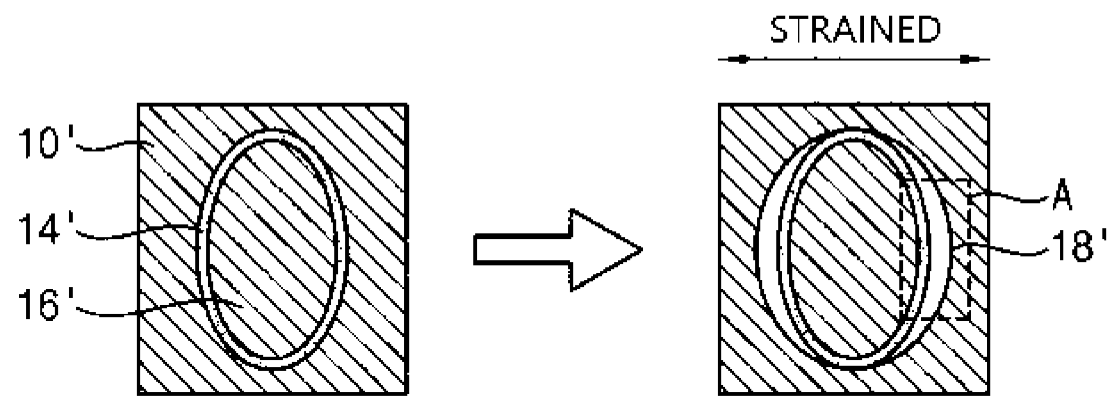
FIGS. 9A, 9B, 10A and 10B are cross-sectional views for explaining a scattering effect of a stretchable transparency-adjusting film according to an embodiment.
Figure 9B:
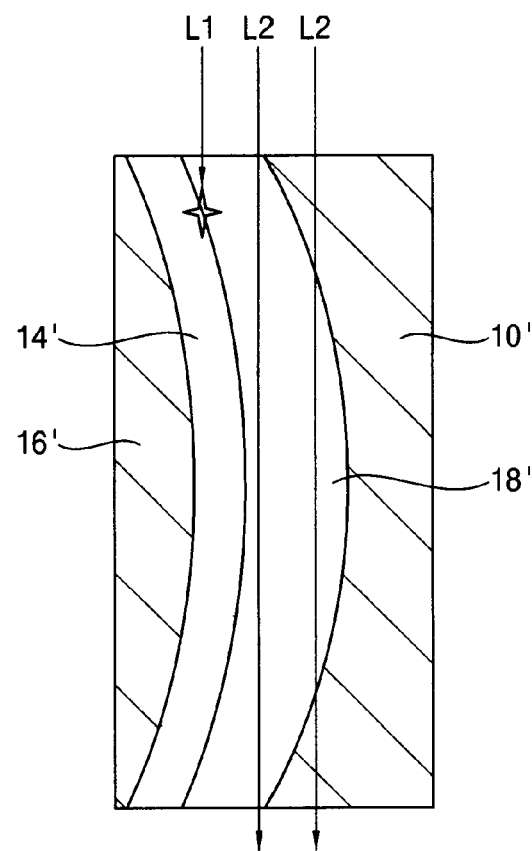
Figure 10A:
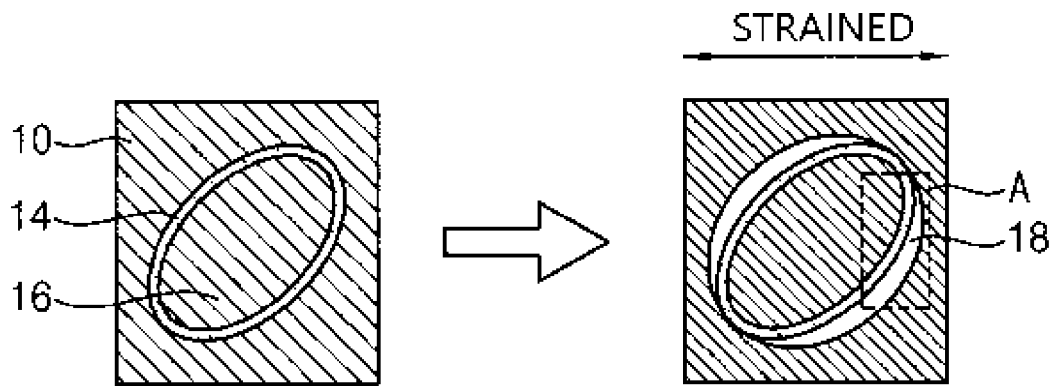
Figure 10B:
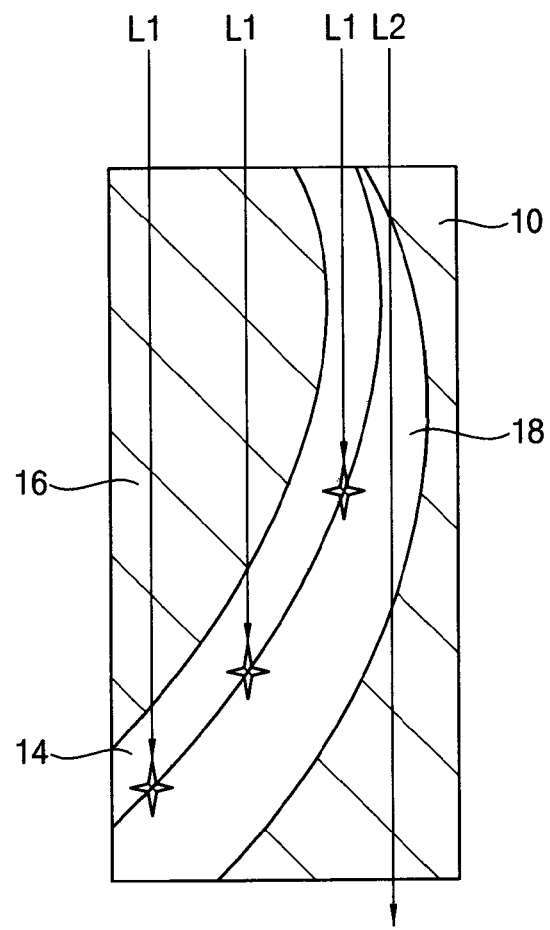

FIGS. 9A, 9B, 10A and 10B are cross-sectional views for explaining a scattering effect of a stretchable transparency-adjusting film according to an embodiment. Particularly, FIGS. 9A and 10A illustrate deformation of a scattering unit when a tensile force is applied thereto, and FIGS. 9B and 10B are enlarged cross-sectional view illustrating the region 'A' of FIGS. 9A and 10A. FIGS. 9A and 9B illustrate a scattering unit without inclination, and FIGS. 10A and 10B illustrate a scattering unit with inclination.

Referring to FIGS. 9A and 10A, when a tensile force is applied to a scattering unit including an inner elastic part 16 or 16', an inorganic thin film 14 or 14' surrounding the inner elastic part 16 or 16' and an outer elastic part 10 or 10', a gap 18 or 18' may be formed between the inorganic thin film 14 or 14' and the outer elastic part 10 or 10'.

For example, scattering of a light may mostly appear at an interface between the inorganic thin film 14 or 14' and the gap 18 or 18'. Referring to FIGS. 9B and 10B, it can be noted that an area overlapping a scattering interface (an interface between the inorganic thin film 14 or 14' and the gap 18 or 18') in a cross-section perpendicular to a progressing direction of a light may be increased in a structure in which a scattering unit is orientated in an inclined direction to the horizontal direction in which a tensile force is applied, with compared to in a structure in which a scattering unit is orientated in a direction vertical to the horizontal direction in which a tensile force is applied. Thus, a scattering effect may be increased in FIG. 10B more than in FIG. 9B because a scattered light L1 to an incident light L2 is increased.

In an embodiment, the inorganic thin film 14 or the inner elastic part 16 may have an oval shape in a cross-section. However, embodiments are not limited thereto, and the inorganic thin film 14 or the inner elastic part 16 may have various shapes capable of having orientation.

Figure 11:
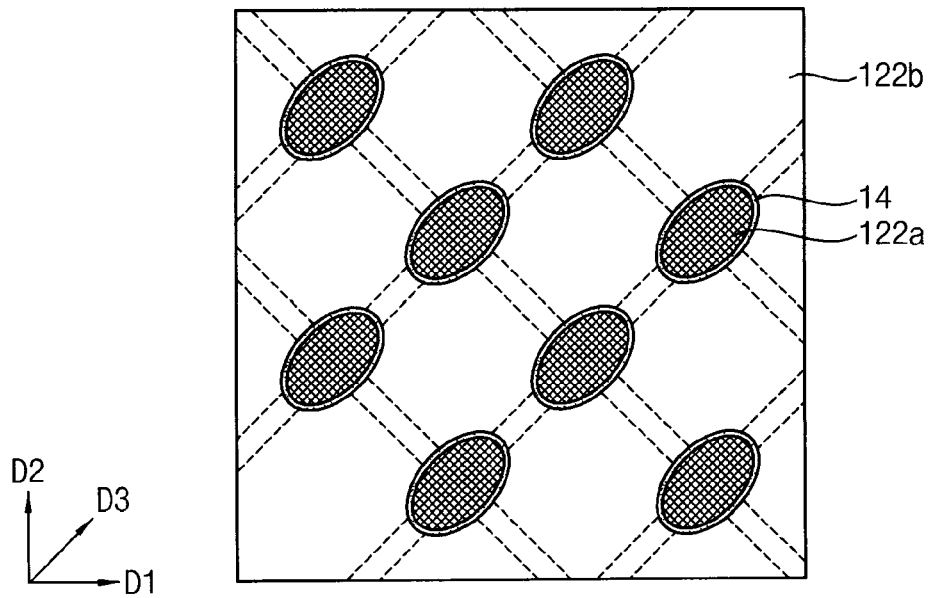
FIGS. 11 and 12 are cross-sectional views illustrating a method for manufacturing a stretchable transparency-adjusting film according to an embodiment.
Figure 12:
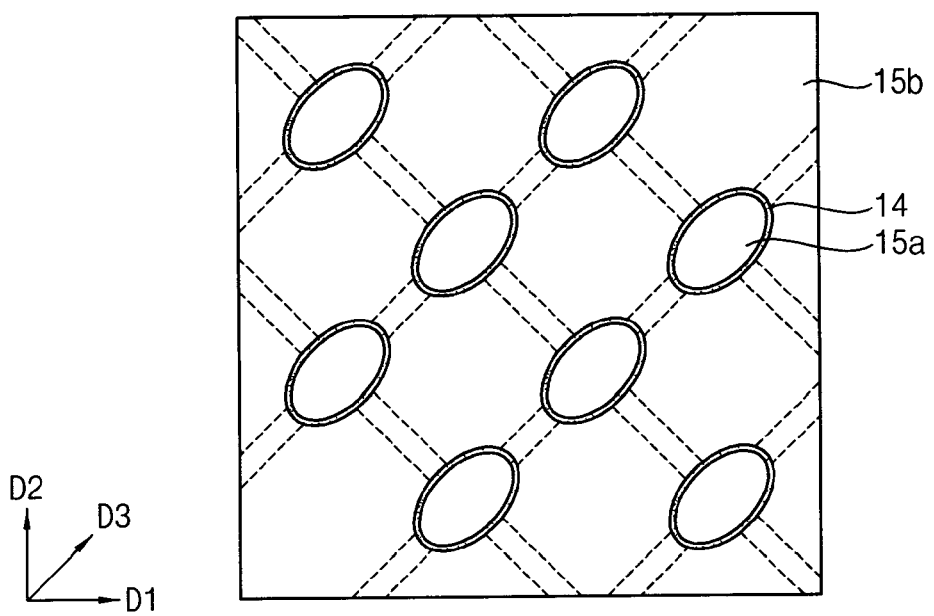

FIGS. 11 and 12 are cross-sectional views illustrating a method for manufacturing a stretchable transparency-adjusting film according to an embodiment.

Referring to FIG. 11, a porous template film including a template part 122a and a pore part 122b. An inorganic thin film 14 is formed on a surface of the template part 122a of the porous template film. The inorganic thin film 14 may be formed by ALD or the like and may have a shell shape surrounding the template part 122a. Thus, at least a portion of the pore part 122b may be maintained and unfilled.

Referring to FIG. 12, the template part 122a is removed. Thus, a three-dimensional structure including an inner pore part 15a, which is three-dimensionally continuous, an inorganic thin film 14 surrounding the inner pore part 15a and an outer pore part 15b surrounding the inorganic thin film 14 may be formed.

For example, the template part 122a may be removed by a remover such as acetone, ethanol, NMP, DMSO or the like.

Figure 8:
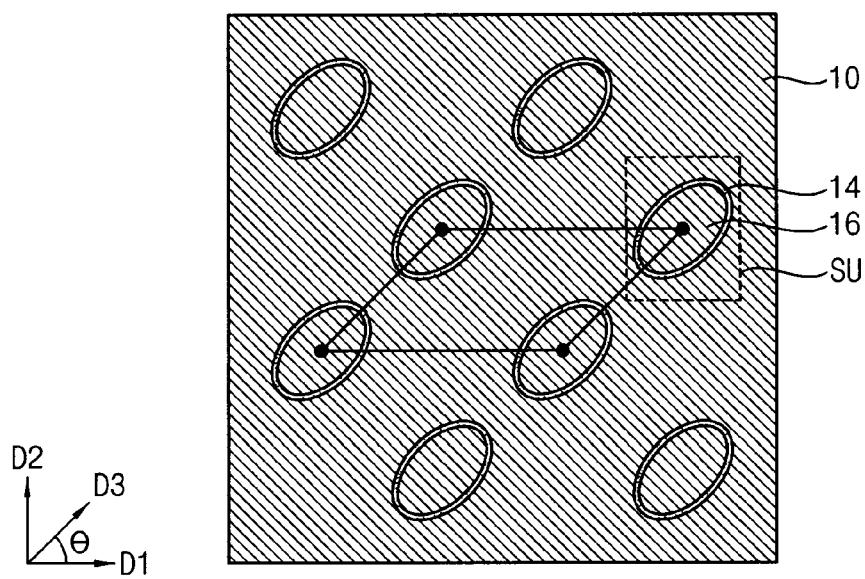

Thereafter, a liquid silicone resin or the like may be provided to fill the inner pore part 15a and the outer pore part 15b of the three-dimensional structure to form a stretchable transparency-adjusting film including an outer elastic part 10, an inner elastic part 16 and the inorganic thin film 14 as illustrated in FIG. 8.

According to embodiments, a stretchable transparency-adjusting film in which scattering units are arranged three-dimensionally may be obtained. A transparency of the stretchable transparency-adjusting film may be adjusted by strain. Furthermore, the scattering units may be orientated in an inclined direction to increase a scattering area. Thus, a scattering effect and a contrast of the stretchable transparency-adjusting film may be increased. Thus, a transparency of the stretchable transparency-adjusting film may be adjusted by less tensile force and less strain. Thus, availability of the stretchable transparency-adjusting film may be increased, and damage to the stretchable transparency-adjusting film due to excessive strain may be prevented.

Figure 13:
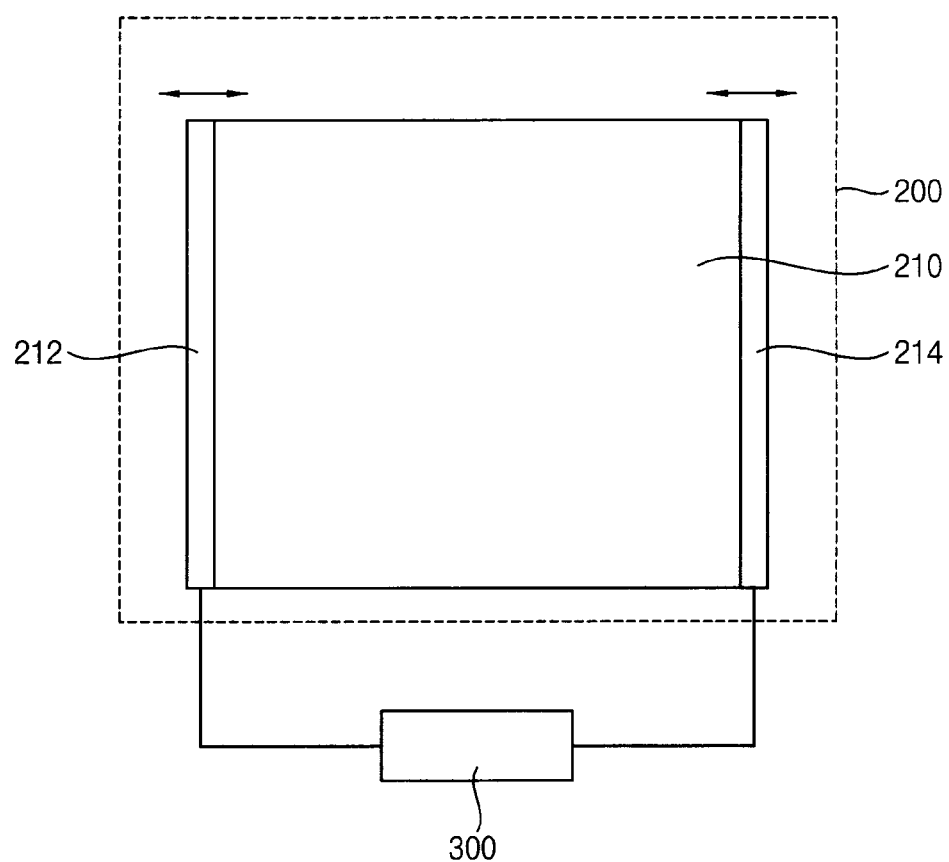
FIG. 13 is a schematic view illustrating a smart window according to an embodiment.

FIG. 13 is a schematic view illustrating a smart window according to an embodiment.

A smart window according to an embodiment may include a window part 200 and a driving part 300.

Referring to FIG. 13, a window part 200 may include a stretchable transparency-adjusting film 210 and fixing clamps 212 and 214 coupled to both ends of the stretchable transparency-adjusting film 210. At least one of the fixing claims 212 and 214 may move by a driving motor operated by a control signal to apply a tensile force to the stretchable transparency-adjusting film 210 thereby causing a strain of the stretchable transparency-adjusting film 210 or restoring the strained stretchable transparency-adjusting film 210. The stretchable transparency-adjusting film 210 may have a same configuration as previously explained embodiment.

The driving part 300 may include the driving motor for moving the fixing clamps 212 and 214 of the window part 200 and a control part for controlling the driving motor. Furthermore, the driving part 300 may further include a sensor and/or a communication part.

For example, the driving part 300 may include at least one servo motor, a micro controller (MCU) providing a driving signal to operate the servo motor, an ambient illumination sensor providing an illumination information signal to the micro controller and a wireless communication module.

For example, the ambient illumination sensor may detect ambient light amount and provide to the illumination information signal to the micro controller. The micro controller may provide the driving signal to operate the servo motor when the illumination information signal satisfies a predetermined condition. For example, when a value of the illumination information signal is more than a reference value, the stretchable transparency-adjusting film 210 may be strained to decrease a transparency thereof. When a value of the illumination information signal is equal to or less than the reference value, the stretchable transparency-adjusting film 210 may be restored to increase a transparency thereof.

The wireless communication module may receive a control signal, an update information or the like from an external communication device, for example, a smart phone and provide them to the micro controller. Accordingly, the driving part may be operated by an external user or an external driving device. However, a communication module used for an embodiment is not limited thereto. For example, a wire communication module may be used for a smart window.

A stretchable transparency-adjusting film according to embodiments may be used for an optical apparatus, a smart window, a projector, a deformable transparent partition, a light-blocking apparatus or the like, and may be applied to a construction, a vehicle (motor vehicle, vessel, aircraft or the like), a home appliance, a display device or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A stretchable transparency-adjusting film comprising:
an inner elastic part having a three-dimensional network shape, the inner elastic part including a first elastomer;
an inorganic thin film surrounding the inner elastic part, the inorganic thin film including alumina, the inorganic thin film having a thickness of 60 nm to 80 nm; and an outer elastic part surrounding the inorganic thin film, the outer elastic part including a second elastomer, when a tensile force is applied to the stretchable transparency-adjusting film in a horizontal direction, a gap is formed between the outer elastic part and the inorganic thin film, wherein a scattering unit defined by the inner elastic part, the inorganic thin film and the outer elastic part in a cross-section is orientated in an inclined direction to a vertical direction and the horizontal direction, wherein the inclined direction is inclined to the horizontal direction by 50° to 80°, when a tensile force is not applied to the stretchable transparency-adjusting film in the horizontal direction, wherein at least one of the first elastomer and the second elastomer includes polydimethylsiloxane.

2. The stretchable transparency-adjusting film of claim 1, wherein lines connecting four scattering units adjacent to each other in a cross-sectional view form a parallelogram shape.

3. The stretchable transparency-adjusting film of claim 1, wherein the inorganic thin film has an inclined body-centered tetragonal structure.

4. A smart window comprising:

a window part including a stretchable transparency-adjusting film and a fixing clamp that fixes an end of the stretchable transparency-adjusting film; and a driving part adjusting a strain of the stretchable transparency-adjusting film, wherein the stretchable transparency-adjusting film includes:

an inner elastic part having a three-dimensional network shape, the inner elastic part including a first elastomer;

an inorganic thin film surrounding the inner elastic part, the inorganic thin film including alumina, the inorganic thin film having a thickness of 60 nm to 80 nm; and an outer elastic part surrounding the inorganic thin film, the outer elastic part including a second elastomer, wherein a scattering unit defined by the inner elastic part, the inorganic thin film and the outer elastic part in a cross-section is orientated in an inclined direction to a vertical direction and a horizontal direction, wherein the stretchable transparency-adjusting film has a transparency variable according to a gap formed therein when strained in the horizontal direction, wherein the inclined direction is inclined to the horizontal direction by 50° to 80°, when the stretchable transparency-adjusting film is not strained in the horizontal direction, wherein at least one of the first elastomer and the second elastomer includes polydimethylsiloxane.

5. The smart window of claim 4, wherein lines connecting four scattering units adjacent to each other in a cross-sectional view form a parallelogram shape.

6. The smart window of claim 4, wherein the driving part includes:

a driving motor for moving the fixing clamp;

a controller for controlling the driving motor; and an ambient illumination sensor for detecting an ambient light amount and providing an illumination information signal to the controller.

* * * * *